(12) United States Patent
Brick

(10) Patent No.: US 8,576,889 B2
(45) Date of Patent: Nov. 5, 2013

(54) METHOD OF PRODUCING A RADIATION-EMITTING COMPONENT AND RADIATION-EMITTING COMPONENT

(75) Inventor: Peter Brick, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 781 days.

(21) Appl. No.: 12/670,984

(22) PCT Filed: Aug. 18, 2008

(86) PCT No.: PCT/DE2008/001377
§ 371 (c)(1),
(2), (4) Date: Apr. 12, 2010

(87) PCT Pub. No.: WO2009/039808
PCT Pub. Date: Apr. 2, 2009

(65) Prior Publication Data
US 2010/0189153 A1   Jul. 29, 2010

(30) Foreign Application Priority Data

Sep. 24, 2007 (DE) .......................... 10 2007 045 499
Oct. 26, 2007 (DE) .......................... 10 2007 051 315

(51) Int. Cl.
*H01S 5/00*       (2006.01)
(52) U.S. Cl.
USPC ..................................... 372/45.01; 372/43.01
(58) Field of Classification Search
USPC .................................. 372/29.014, 43.01–45.01
See application file for complete search history.

(56) References Cited

U.S. PATENT DOCUMENTS

| | | |
|---|---|---|
| 5,073,041 A | 12/1991 | Rastani |
| 5,815,521 A | 9/1998 | Hobson et al. |
| 6,274,891 B1 | 8/2001 | Tanaka et al. |
| 6,298,079 B1 | 10/2001 | Tanaka et al. |
| 6,690,700 B2 | 2/2004 | Takeuchi et al. |
| 6,879,613 B2 | 4/2005 | Takeuchi et al. |
| 6,961,358 B2 | 11/2005 | Erbert et al. |
| 7,409,134 B2 | 8/2008 | Qiu |
| 2001/0038656 A1 | 11/2001 | Takeuchi et al. |
| 2002/0154675 A1 | 10/2002 | Deng et al. |
| 2003/0031220 A1 | 2/2003 | Takeuchi et al. |
| 2003/0122134 A1* | 7/2003 | Hirukawa ........................ 257/79 |

(Continued)

FOREIGN PATENT DOCUMENTS

| | | |
|---|---|---|
| CN | 1434996 A | 8/2003 |
| CN | 1528036 A | 9/2004 |

(Continued)

OTHER PUBLICATIONS

Zou, et al., "The Chapter II: Gaussian Beam," Laserphysik, 1991, 3 pages, Beijing University Publishing House.

(Continued)

*Primary Examiner* — Kinam Park
(74) *Attorney, Agent, or Firm* — Slater & Matsil, L.L.P.

(57) ABSTRACT

A method of producing a radiation-emitting component is provided. A far field radiation pattern is predetermined. From the predetermined radiation pattern a refractive index profile for the radiation-emitting component is determined in a direction extending perpendicularly to a main emission direction of the component. A structure is determined for the component, such that the component includes the previously determined refractive index profile. The component is configured according to the previously determined structure.

18 Claims, 11 Drawing Sheets

(56) References Cited

U.S. PATENT DOCUMENTS

| | | | |
|---|---|---|---|
| 2004/0047378 A1* | 3/2004 | Erbert et al. ............... | 372/44 |
| 2004/0101986 A1* | 5/2004 | Kozaki et al. ............... | 438/22 |
| 2005/0087735 A1* | 4/2005 | Behringer et al. ............ | 257/14 |
| 2006/0054843 A1 | 3/2006 | Simpson et al. | |
| 2006/0274793 A1 | 12/2006 | Qiu | |
| 2007/0153867 A1 | 7/2007 | Muller | |
| 2009/0304037 A1 | 12/2009 | Takeuchi et al. | |

FOREIGN PATENT DOCUMENTS

| | | |
|---|---|---|
| DE | 100 46 580 A1 | 4/2002 |
| DE | 10 2006 010 728 A1 | 6/2007 |
| JP | 05-251813 A | 9/1993 |
| JP | 2002-329926 A | 11/2002 |

OTHER PUBLICATIONS

Freude, W., et al., "Refractive-Index Profile Determination of Single-Mode Fibres by Far-Field Power Measurements at 1300 nm," Electronics Letters, Aug. 28, 1986, pp. 945-947, vol. 22 No. 18, Michael Faraday House, Stevenage, United Kingdom.

Yen, S. T., et al., "Theoretical Investigation on Semiconductor Lasers with Passive Waveguides," IEEE Journal of Quantum Electronics, Jan. 1996, pp. 4-13, vol. 32 No. 1, IEEE Photonics Society, Piscataway, New Jersey, United States.

Gupta, M. C., "Handbook of Photonics," 1997, pp. 292-298, CRC Press, L.L.C., Boca Raton, Florida, United States.

* cited by examiner

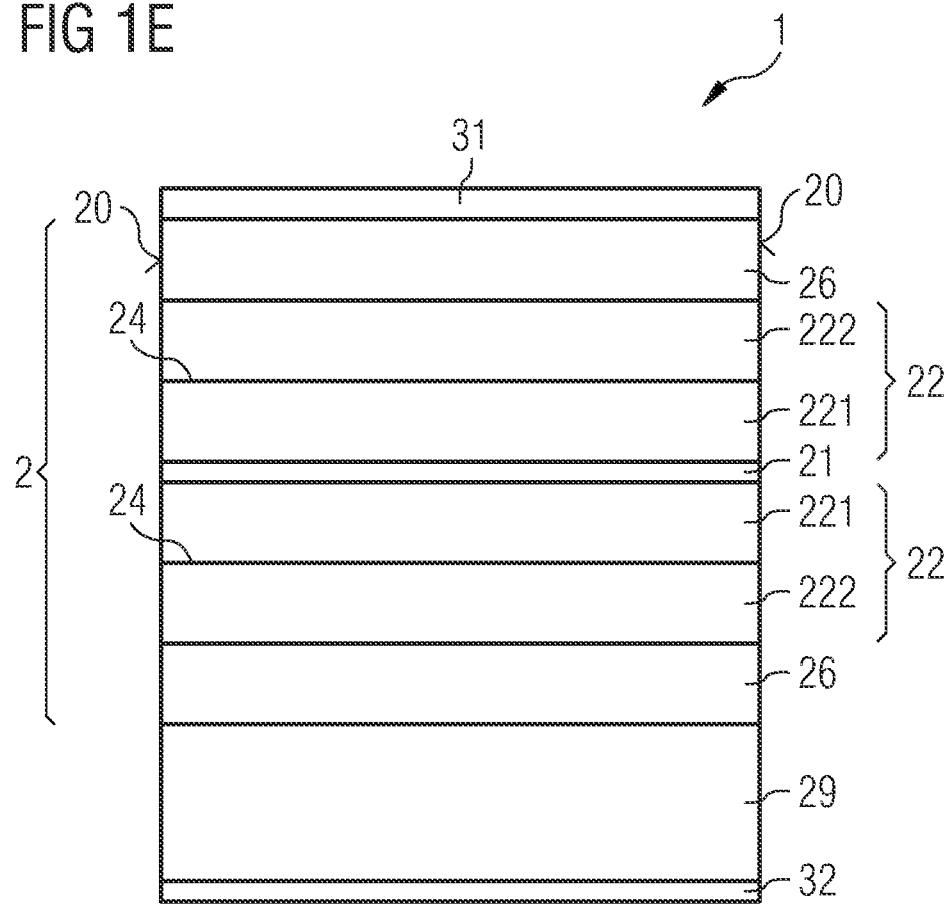

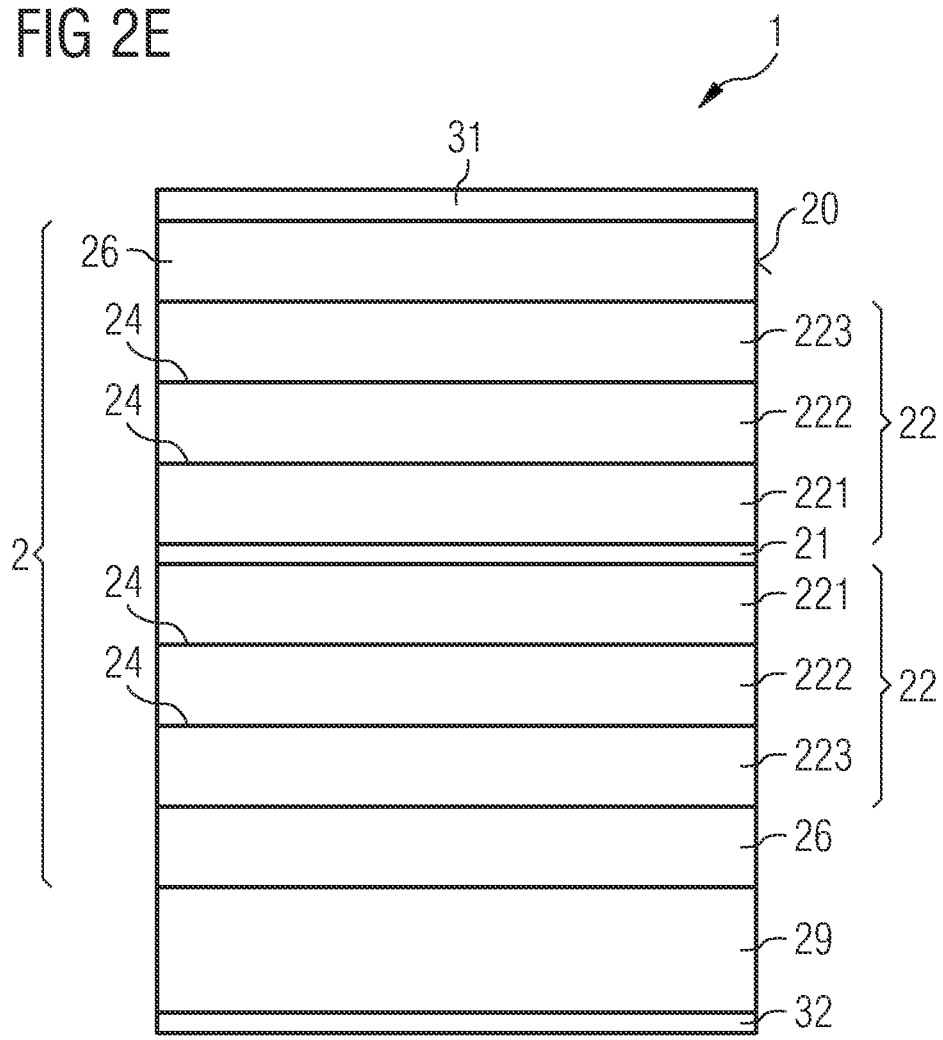

METHOD OF PRODUCING A RADIATION-EMITTING COMPONENT AND RADIATION-EMITTING COMPONENT

This patent application is a national phase filing under section 371 of PCT/DE2008/001377, filed Aug. 18, 2008, which claims the priority of German patent applications 10 2007 045 499.8, filed Sep. 24, 2009 and 10 2007 051 315.3, filed Oct. 26, 2007, each of which is incorporated herein by reference in its entirety.

TECHNICAL FIELD

The present application relates to a method of producing a radiation-emitting component and to a radiation-emitting component.

BACKGROUND

In the case of semiconductor lasers used as pump lasers, it is desirable for laser radiation to be emitted with a maximally homogeneous far field. Typically, however, semiconductor lasers emit radiation with a Gaussian-like far field. Starting from a center axis of the radiation profile, the radiation intensity thus drops comparatively rapidly towards the outside.

SUMMARY

A method can be used to produce solid-state lasers whose far field is better adapted to the intended application of the laser. In particular, the laser may exhibit improved homogeneity of the emitted radiation in the far field.

According to one embodiment, in a method for the production of a radiation-emitting component, a far field radiation pattern is predetermined. In a direction extending perpendicularly to a main emission direction of the component a refractive index profile is determined from the predetermined radiation pattern. A structure is determined for the component, such that the component exhibits the previously determined refractive index profile. The component is configured according to the previously determined structure.

The refractive index profile of the component is thus configured in such a way as to be purposefully conformed to a predetermined far field radiation pattern. In this way, a far field radiation pattern may be achieved which has particularly high homogeneity. In this way it is possible to improve the homogeneity of the radiation emerging from the radiation-emitting component. Subsequent homogenization, for instance by means of external "homogenizers", may be dispensed with. Subsequent selection of a sub-region of a Gaussian-like profile in which homogeneity is sufficiently high is also unnecessary.

Preferably, the associated near field is determined from the predetermined far field radiation pattern. This preferably proceeds by means of a Fourier transformation, in which the associated near field follows from the far field.

In the event of doubt, the far field is regarded as the electromagnetic field of the emitted radiation at a distance from the radiation-emitting component, in particular, from an active region provided for generating radiation, which is large in comparison with the wavelength of the emitted radiation.

Unlike the far field, the near field brings about interaction with the active region of the radiation-emitting component provided for generating radiation.

In a preferred configuration, the refractive index profile is determined from the near field. The following proportionality relationship here applies for the refractive index n:

$$n \sim [(n_{\text{eff}}^2 k^2 E_N(z) - E_N''(z))/(k^2 E_N(z))]^{1/2}$$

wherein the z axis extends perpendicularly to the main emission direction of the component, $E_N(z)$ is the electromagnetic field of the near field and $E''_N(z)$ is the second derivative of the electromagnetic field of the near field $E_N$. k is here the wave vector of the electromagnetic radiation and $n_{\text{eff}}$ is the effective refractive index.

In a preferred configuration, a semiconductor body having a semiconductor layer sequence is deposited, the semiconductor layer sequence comprising the active region provided for generating radiation. It is also preferable for the refractive index profile to extend at least in part within the semiconductor body having the semiconductor layer sequence.

In a further preferred configuration, the refractive index profile is constructed by means of a suitable material composition in a deposition direction for the semiconductor layer sequence of the semiconductor body. Preferably, the semiconductor layers of the semiconductor layer sequence contain at least in part a ternary, quaternary or quinternary compound semiconductor. With such compound semiconductors, the refractive index of the material may be simply adjusted by means of the material composition. By depositing semiconductor layers with different refractive indices, the determined refractive index profile may thus be formed. The refractive index does not necessarily have to be constant within a semiconductor layer. For example, the refractive index of a semiconductor layer may also comprise a gradient or increase or decrease in steps.

In a further preferred configuration, the far field radiation pattern is predetermined along two axes positioned obliquely or perpendicularly to one another. On the basis of the predetermined radiation pattern, a further refractive index profile may be determined perpendicular to the main emission direction and obliquely or perpendicularly to the refractive index profile. The refractive index profile here extends parallel to the first axis and the further refractive index profile extends parallel to the second axis. The structure of the component may subsequently be determined in such a way that the component exhibits the previously determined further refractive index profile.

In this case, the further refractive index profile may likewise be calculated from the near field in accordance with the formula stated in connection with the refractive index profile, the near field used for the calculation accordingly being that which arises from the predetermined profile of the far field along the second axis.

In a preferred further development, the further refractive index profile is formed by means of recesses in the component, in particular, in the semiconductor body. In this case, the recesses may be formed by removing semiconductor body material with the semiconductor layer sequence, for example, mechanically and/or chemically, for instance by means of wet chemical or dry chemical etching.

According to one embodiment, a radiation-emitting component with an active region provided for generating radiation includes a main emission direction and, perpendicular to the main emission direction, a refractive index profile. The refractive index profile is configured in such a way that, due to the refractive index profile, a radiation pattern of the far field radiation generated during operation of the component at a predetermined distance from the active region exhibits greater homogeneity than a Gaussian-shaped radiation pattern.

The greater homogeneity is achieved by purposefully forming the refractive index profile in such a way that the resultant far field corresponds to the predetermined far field or at least approaches it.

In a preferred configuration, the refractive index profile is formed by means of field-shaping layers arranged on each side of the active region. It is additionally preferred for the refractive index profile in each case to include an abrupt junction on each side, at which the refractive index in each case increases from the standpoint of the active region.

According to a further embodiment, a radiation-emitting component with an active region provided for generating radiation includes a main emission direction, field-shaping layers being arranged on each side of the active region and a refractive index profile being formed perpendicular to the main emission direction by means of the field-shaping layers. On each side of the active region the refractive index profile in each case includes an abrupt junction, at which the refractive index in each case increases from the standpoint of the active region.

Such a component may exhibit a radiation pattern with a comparatively homogeneous far field.

In a preferred further development of the further embodiment, the refractive index profile is configured in such a way that, due to the refractive index profile, a radiation pattern of the far field radiation generated during operation of the component at a predetermined distance from the active region exhibits greater homogeneity than a Gaussian-shaped radiation pattern.

Due to the described refractive index profile, the field-shaping layers bring about a near field, resulting in a far field which is homogenized relative to a Gaussian far field. The homogeneity of the radiation emitted by such a component may thus be greater than in the case of a conventional semiconductor laser with a Gaussian-type far field.

A homogeneous far field should be understood, in particular, to mean a far field which in a given angular range exhibits a maximally constant intensity distribution and furthermore does not fall below a predetermined threshold value.

As a measure of the homogeneity of the far field, use may be made, in particular, of the area of a rectangle of maximum area, which extends under a curve of the intensity profile of the far field. The far field is here the intensity of the radiation emitted by the radiation-emitting component as a function of the angle $\theta$ to the main emission direction. For a far field with Gaussian profile, the maximum rectangle area is 48.4%.

A radiation-emitting component in which the far field thus exhibits greater homogeneity at a predetermined distance than a Gaussian-shaped radiation pattern is particularly suitable for optical pumping of lasers, for illumination or for imaging onto optical systems.

An abrupt junction is understood to mean, in particular, a region in which the refractive index changes rapidly compared with the regions adjoining this abrupt junction. The change does not necessarily have to take the form of an abrupt junction between two values. The change may, for example, also proceed in steps or linearly from one to the other value.

In a preferred configuration, a rectangle of maximum area which extends under a curve of the intensity profile of the far field, fills at least 50%, particularly preferably at least 60%, most preferably at least 65%, of the total area under the curve of the intensity profile of the far field. The larger this area the greater may be the proportion of useful radiation emitted by the component.

The intensity profile is here the profile of the far field in a direction extending parallel to the refractive index profile.

In a preferred configuration at least one field-shaping layer includes a sub-region in which the refractive index decreases, preferably continuously, as the distance from the active region increases. Furthermore, the at least one field-shaping layer may include a further sub-region, in which the refractive index likewise decreases as the distance from the active region increases. In this case, the sub-region and the further sub-region are preferably arranged on the same side of the active region.

In a preferred further development the abrupt junction is arranged between the first sub-region and the second sub-region. From the standpoint of the active region, the refractive index profile thus decreases, preferably continuously, on each side of the respective abrupt junction.

Obtaining a radiation pattern with a particularly high level of homogeneity is consequently facilitated.

In the region of the abrupt junction, the refractive index profile preferably exhibits a steeper slope in quantity terms than in the sub-regions adjoining the abrupt junction. For example, the refractive index profile, in particular, in the region of the field-shaping layers, may be saw-tooth-shaped.

In a preferred configuration, the component includes a semiconductor body with a semiconductor layer sequence. The active region is preferably formed in the semiconductor body. Furthermore, the field-shaping layers may also be formed at least in part in the semiconductor body.

Preferably, the refractive index profile is formed at least in part in the semiconductor body.

In one preferred further development the refractive index profile extends perpendicular to a main direction of extension of the semiconductor layers of the semiconductor body. The refractive index profile thus extends in a deposition direction of the semiconductor layers of the semiconductor body. The semiconductor layers of the semiconductor body are preferably produced epitaxially, for instance by means of MOVPE or MBE.

In one further preferred further development the field-shaping layers each contain a compound semiconductor material. It is additionally preferred for the refractive index profile to be adjusted by varying the composition of the compound semiconductor material. Because the refractive index is dependent on material composition, it is thus possible to determine from the determined refractive index profile the material composition necessary therefor.

In a preferred configuration the radiation-emitting component has a further refractive index profile perpendicular to the main emission direction and perpendicular to the refractive index profile. By means of this further refractive index profile, purposeful field-shaping of the near field may be achieved, in particular, within the semiconductor body. In this way the resultant far field of the emitted radiation may be adjusted relative to two axes positioned obliquely or perpendicularly relative to one another and thus shaped according to the predetermined far field.

In a preferred configuration the further refractive index profile is formed by means of recesses. The recesses preferably extend into the semiconductor body, in particular, along the further refractive index profile.

By means of the recesses, the radiation oscillating in the refractive index averaged in the main emission direction may be adjusted in the direction.

In a preferred further development the recesses are at least partially filled with a filler material. The filler material furthermore preferably has a smaller refractive index than the material in which the recesses are formed. In particular, the filler material may have a smaller refractive index than the semiconductor material adjoining the recesses. In comparison with the refractive index of the semiconductor material, the averaged refractive index may thus be reduced by means of the recesses.

From a standpoint external to the semiconductor body, the recesses may taper as their depth increases. A profile of the averaged refractive index which decreases continuously to the edge of the semiconductor body may thus be achieved.

In a further preferred configuration, the component includes a further active region, which is provided for producing radiation. The total radiant power emerging from the component may thus be increased.

A tunnel region may be formed between the active region and the further active region. By means of this tunnel region, the active region and the further active region may be connected together electrically in series. The tunnel zone is preferably formed by means of two semiconductor layers, which are in each case highly doped with mutually opposing signs. Preferably, the doping concentration amounts in each case to at least $10^{18}$ cm$^{-3}$, particularly preferably at least $10^{19}$ cm$^{-3}$.

In one variant configuration, the radiation produced in the active region and the radiation produced in the further active region have a common transverse optical mode. These radiation fractions may thus be coherently coupled.

It is also preferred for the tunnel region to be arranged in a node of the transverse optical mode. Absorption of the optical radiant power in the tunnel zone may thus be prevented or at least reduced.

The further active region may be formed in the field-shaping layers. In particular, one of the abrupt junctions may be arranged between the active region and the further active region.

In one alternative variant configuration, further field-shaping layers are arranged on each side of the further active region, the refractive index profile in each case having a further abrupt junction on each side of the further active region, at which further abrupt junction the refractive index in each case increases from the standpoint of the further active region.

In this case the active region and the further active region are preferably arranged one above the other, the active regions each being assigned their own field-shaping layers.

In this case, the further field-shaping layers may include at least one of the features described in connection with the field-shaping layers. Furthermore, the field-shaping layers, which are assigned to the active region, and the further field-shaping layers, which are assigned to the further active region, may be of the same kind. In contrast, the field-shaping layers and the further field-shaping layers may differ from one another and, in particular, be conformed to the active region or to the further active region respectively. In this case, the active region and the further active region may also be provided for the emission of radiation with different wavelengths.

The active region and/or the field-shaping layers preferably contain a compound semiconductor material, particularly preferably a III-V compound semiconductor material, in particular, consisting of the material combination (AlInGa)(AsPNSb), i.e., a combination of at least one of the stated elements from the third group of the periodic table of elements with at least one of the stated elements from the fifth group of the periodic table of elements. The material may be selected, in particular, from the group consisting of $Al_xIn_yGa_{1-x-y}As$, $Al_xIn_yGa_{1-x-y}P$, $Al_xIn_yGa_{1-x-y}N$ and $Al_xIn_yGa_{1-x-y}Sb$, in each case with $0 \leq x \leq 1$, $0 \leq y \leq 1$ and $x+y \leq 1$. Using these materials, radiation may be produced from the ultraviolet through the visible into the infrared range of the spectrum.

The described configuration of the refractive index profile for homogenizing the far field is applicable in principle to any coherent emitter.

Preferably, the radiation-emitting component is embodied as an edge-emitting semiconductor laser component. In an edge-emitting semiconductor laser element, the main emission direction extends parallel to the main plane of extension of the semiconductor layers of the semiconductor body.

An embodiment of the radiation-emitting component as a surface-emitting semiconductor laser component, for instance as a VCSEL (vertical cavity surface emitting laser), a VECSEL (vertical external cavity surface emitting laser) or a disc laser, is also conceivable. In the case of a surface-emitting semiconductor laser element the main emission direction of the component extends perpendicular to the main plane of extension of the semiconductor layers of the semiconductor body.

In a preferred further development, the radiation-emitting component is embodied as a pump laser.

The method described further above is particularly suitable for production of the radiation-emitting component. Features listed in connection with the radiation-emitting component may therefore also be used for the method and vice versa.

BRIEF DESCRIPTION OF THE DRAWINGS

Further features, advantageous configurations and convenient aspects are revealed by the following description of the exemplary embodiments in conjunction with the figures, in which:

FIGS. 1A to 1E show a first exemplary embodiment of a method of producing a radiation-emitting component, FIGS. 2A to 2E show a second exemplary embodiment of a method of producing an optoelectronic component.

Identical, similar or identically acting elements are provided with identical reference numerals in the figures.

The figures are in each case schematic representations and are therefore not necessarily true to scale. Rather, comparatively small elements and, in particular, layer thicknesses may be illustrated on an exaggeratedly large scale for clarification.

DETAILED DESCRIPTION OF ILLUSTRATIVE EMBODIMENTS

Figure 1A:
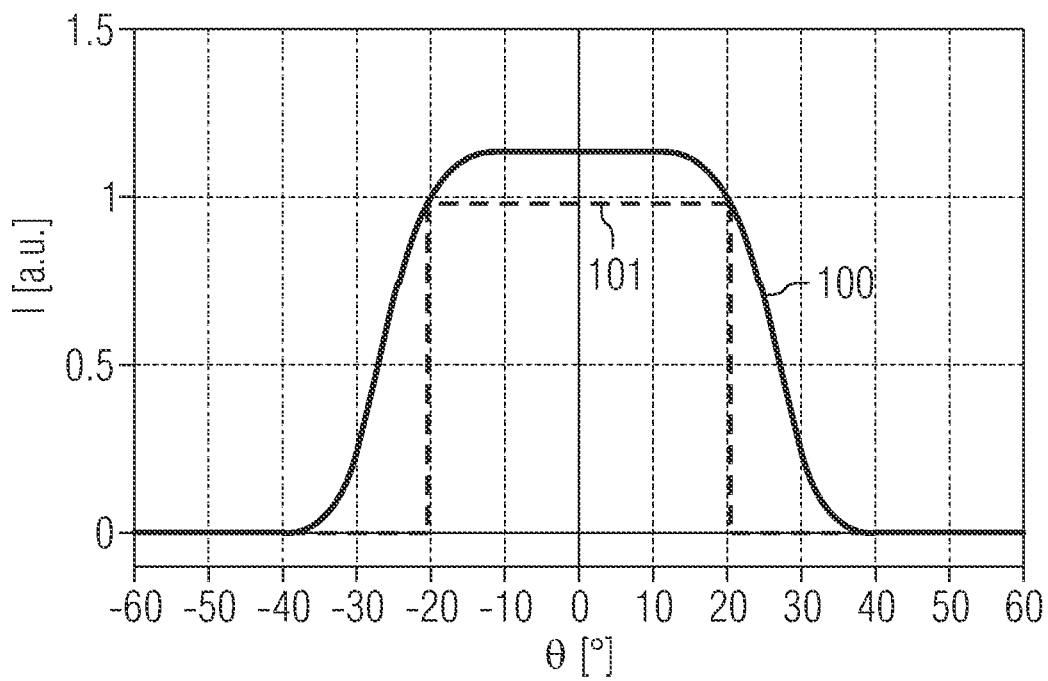
Figure 3:
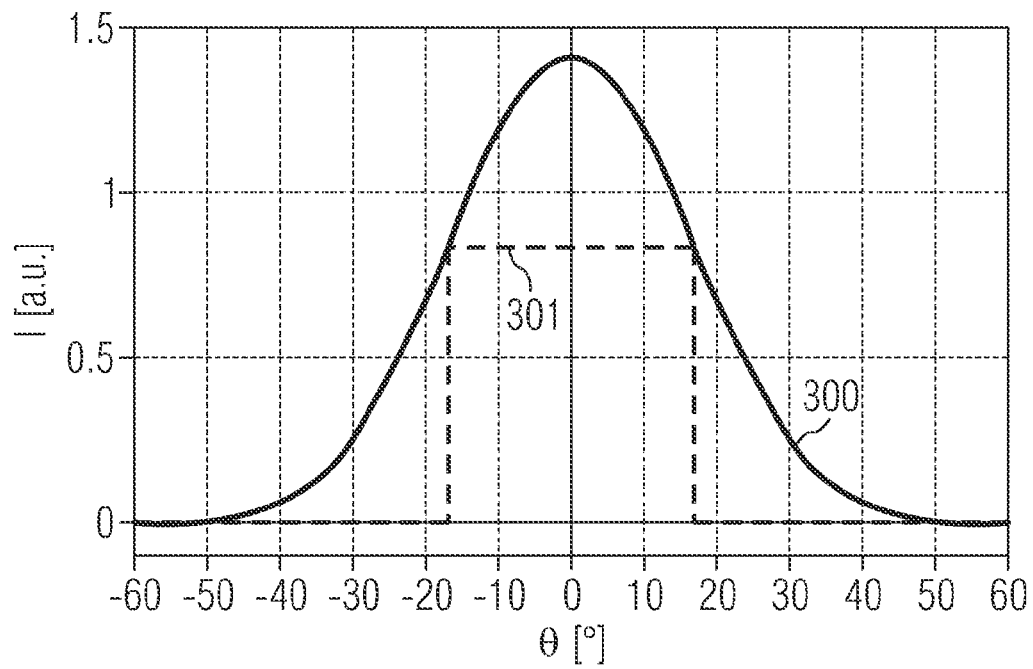
FIG. 3 shows an intensity distribution I for a Gaussian far field as a function of the angle $\theta$ to the main emission direction.

FIG. 1A shows a profile of the intensity I of a profile of the far field predetermined for the radiation-emitting component. The intensity I is here shown as a function of the angle $\theta$ to the main emission direction of the component. At an angle of approx. +/−15° the intensity profile exhibits a plateau-like profile, in which intensity undergoes virtually no change. The broken line 101 here forms the edge of a rectangle of maximum area, which extends under the intensity profile 100. The rectangle here fills approximately 68.8% of the area under the intensity curve 100. In comparison thereto, FIG. 3 shows a corresponding intensity profile 300 with an associated rect-angle of maximum area 301 in relation to a Gaussian radiation profile. In this case the area of the rectangle of maximum area 301 amounts to approximately 48.4% of the area inscribed by the intensity curve 300. The intensity profile 100 of the far field shown in FIG. 1A thus exhibits a significantly greater homogeneity than a Gaussian-shaped intensity distribution.

Figure 1B:
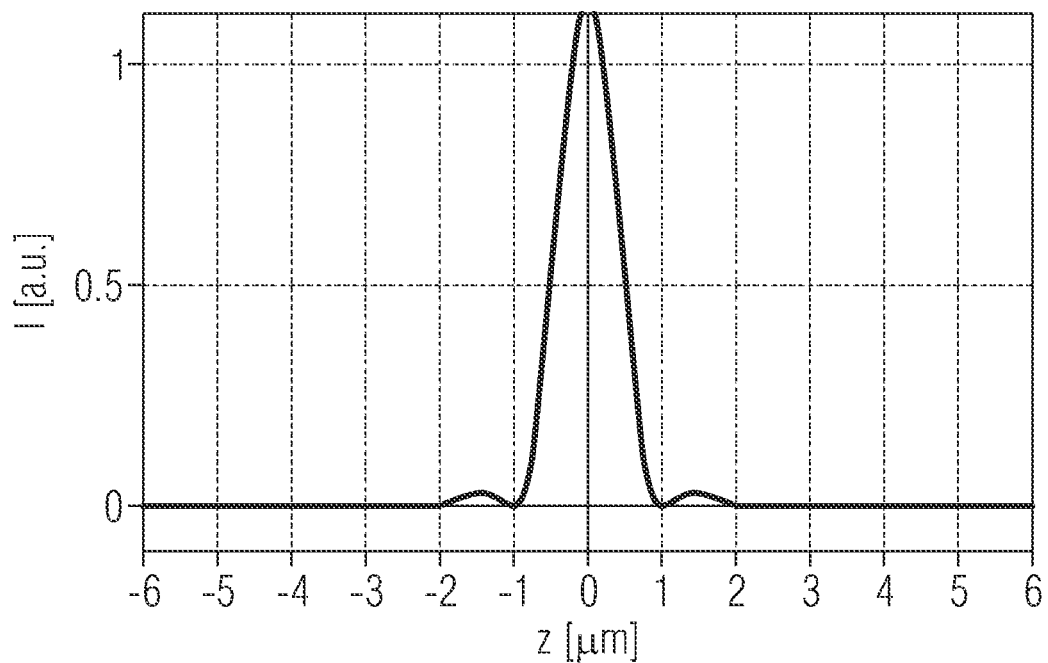
Figure 1C:
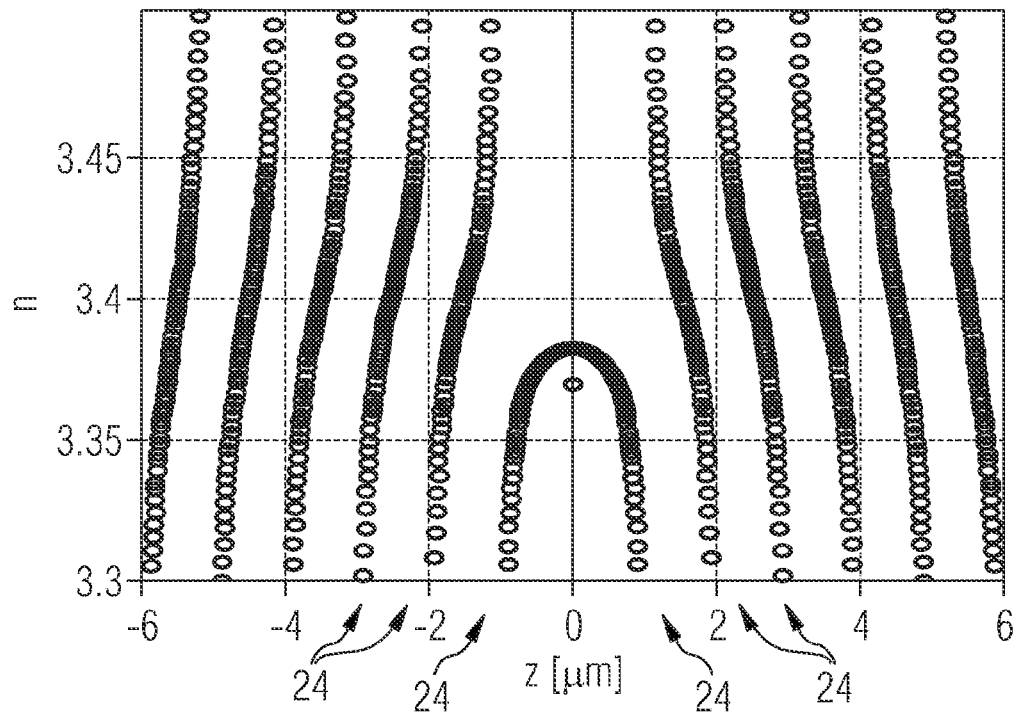

FIG. 1B shows the associated near field. The near field is here obtained from a spatial Fourier transformation from the far field illustrated in FIG. 1A. From this near field it is possible, as shown in FIG. 1C, to determine a refractive index profile in accordance with the relationship stated further above. Starting from the zero point of the z axis the refractive index profile includes a plurality of sub-regions, in which the refractive index decreases in each case as the distance increases. Between these sub-regions there is formed in each case an abrupt junction 24, in which the refractive index jumps from a smaller value to a greater value. The illustrated refractive index profile may be converted into a profile of the material composition. This conversion is here dependent on the material provided in each case for the component.

Figure 1D:
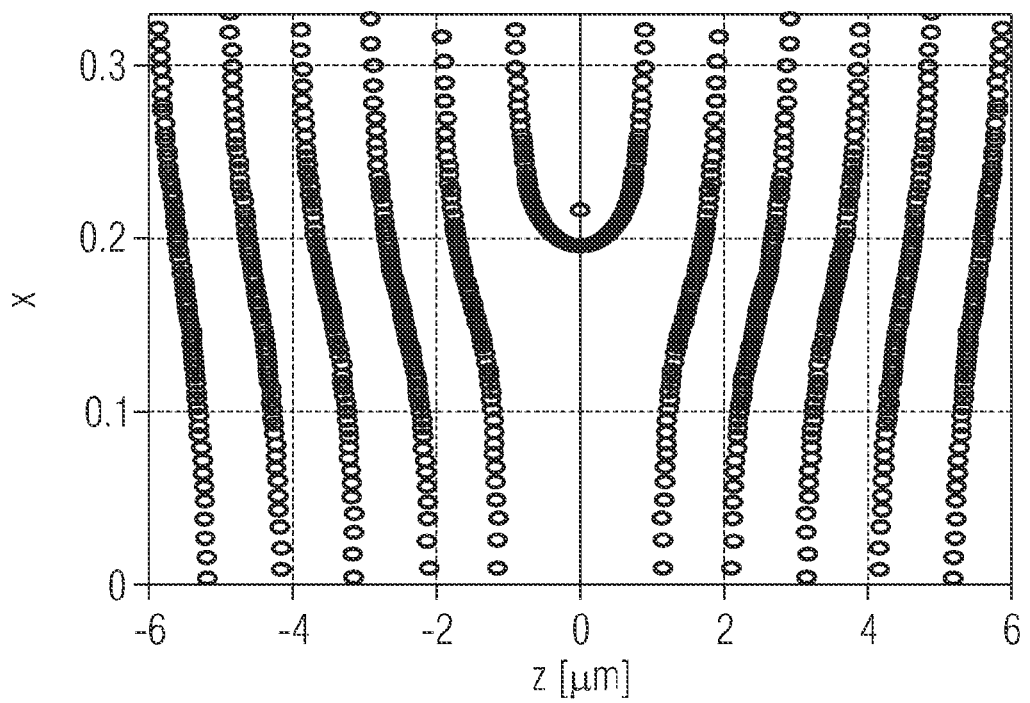

FIG. 1D shows by way of example the profile of the aluminum content x for a semiconductor layer sequence based on $Al_xGa_{1-x}As$. Using a profile for aluminum content according to FIG. 1D, the refractive index profile shown in FIG. 1C may thus be transformed, at least in a good approximation.

The component may be configured on the basis of the structure determined in this way for the component.

As the intensity profile of the near field in FIG. 1B shows, the near field has values which differ from 0 virtually exclusively in a range between −2 and +2 µm around the center axis (z=0). In the case of the radiation-emitting component to be produced, the refractive index profile and thus the material component profile calculated therefrom has therefore only to be transformed within this range. For larger values of z, the intensity of the near field is so low that it is possible to dispense with maximally precise simulation of the calculated refractive index profile.

FIG. 1E is a schematic representation of such a radiation-emitting component 1. The radiation-emitting component 1 includes a semiconductor body 2 with a semiconductor layer sequence. The semiconductor layer sequence forms the semiconductor body 2 and is preferably produced epitaxially, for instance by means of MOVPE or MBE. The semiconductor layer sequence of the semiconductor body 2 is arranged on a carrier 29. The carrier 29 may be the growth substrate, on which the semiconductor layer sequence of the semiconductor body 2 has been deposited. In contrast, the carrier 29 may also differ from the growth substrate. In this case the carrier 29 does not necessarily have to satisfy the stringent requirements for a growth substrate, in particular, with regard to crystalline purity, but may instead be selected with regard to other characteristics, such as thermal or electrical conductivity and/or mechanical stability.

The semiconductor body includes an active region 21, which is provided for producing radiation when the semiconductor body 2 is in operation. A contact layer 31 or a further contact layer 32 is arranged in each case on each side of the active region 21. The contact layers 31, 32 preferably serve in external electrical contacting of the semiconductor body 2. When the radiation-emitting component 1 is in operation, charge carriers may be injected into the active region 21 from two different sides via the contact layers 31 and 32 and there recombine with the emission of radiation.

A field-shaping layer 22 is arranged in each case on each side of the active region 21. A cladding layer 26 is arranged in each case on the side of the field-shaping layers 22 remote from the active region 21. The cladding layers 26 preferably in each case include a refractive index which is smaller than the refractive index of the field-shaping layers 22. Radiation oscillating in the semiconductor body 2 may accordingly be restricted in the vertical direction to a considerable degree to the region between the cladding layers 26.

Furthermore, the semiconductor body 2 includes a side face 20, which delimits the semiconductor body 2 in the lateral direction, i.e., in a main direction of extension of the semiconductor layers of the semiconductor body 2. At least one of the side faces 20 of the semiconductor body 2 is provided for coupling out the coherent radiation produced when the radiation-emitting component 1 is in operation. The radiation-emitting component 1 thus takes the form of an edge-emitting semiconductor laser component.

The side faces 20 may here be produced, for example, chemically, for instance by means of wet chemical or dry chemically etching, or mechanically, for instance by means of cleaving or breaking.

In principle any semiconductor materials which are suitable for producing radiation are suitable for producing the radiation-emitting component 1.

Preferably, the radiation-emitting component 1, in particular, the active region 21 and/or the field-shaping layers 22, contains a III-V compound semiconductor material, in particular, consisting of a material combination (AlInGa)(AsPNSb), the compound semiconductor material containing at least one of the stated elements from the third group and at least one of the stated elements from the fifth group of the periodic table of elements.

III-V compound semiconductor materials are particularly suitable for producing radiation in the ultraviolet ($Al_xIn_yGa_{1-x-y}N$) through the visible ($Al_xIn_yGa_{1-x-y}N$, in particular, for blue to green radiation, or $Al_xIn_yGa_{1-x-y}P$, in particular, for yellow to red radiation) as far as into the infrared ($Al_xIn_yGa_{1-x-y}As$, $Al_xIn_yGa_{1-x-y}Sb$) range of the spectrum. Here in each case $0 \leq x \leq 1$, $0 \leq y \leq 1$ and $x+y \leq 1$ applies, in particular, with $x \neq 1$, $y \neq 1$, $x \neq 0$ and/or $y \neq 0$. Using III-V semiconductor materials, in particular, from the stated material systems, it is additionally possible to achieve high internal quantum efficiencies in the production of radiation.

Described by way of example below is a layer structure for a component which is based on the material system $Al_xIn_yGa_{1-x-y}As$. The active region 21 is formed by means of a quantum layer, which has a thickness of 6.5 nm and is based on $In_{0.13}Ga_{0.87}As$. In contrast, the active region may also include a quantum structure with more than one quantum layer, for instance two or more quantum layers. In particular, by varying the layer thickness and/or the indium content, the peak wavelength of the radiation produced in the active region may be adjusted.

For the purposes of the application, the term "quantum structure" includes, in particular, any structure in which charge carriers may undergo quantization of their energy states by inclusion ("confinement"). In particular, the term quantum structure does not provide any indication of the dimensionality of the quantization. It thus encompasses inter alia quantum wells, quantum wires and quantum dots and any combination of these structures.

Expediently, the semiconductor layers are n-conductively doped on one side of the active region 21 and those on the other side of the active region 21 are at least in part p-conductively doped. For example, the semiconductor layers arranged between the active region 21 and the carrier 29 may be n-conductively doped.

The active region 21 is arranged between two field-shaping layers 22, the field-shaping layers 22 in each case including a sub-region 221 and a further sub-region 222. The further sub-region 222 is here located at a greater distance from the active region 21 than the sub-region 221.

The sub-regions 221 each contain the material $Al_xGa_{1-x}As$, the aluminum content x increasing with the distance away from the active region 21 from a value of 0.20 to a value of 0.35. The increase is preferably continuous. The refractive index accordingly decreases in each case.

The further sub-regions 222 each contain the material $Al_xGa_{1-x}As$, with an aluminum content x which increases with the distance away from the active region 21 from a value of 0.10 to a value of 0.35. The increase is preferably continuous, in particular, linear or at least largely linear. At the abrupt junction 24 which arises between the sub-region 221 and the further sub-region 222, the aluminum content decreases abruptly from 35% to 20%. From the standpoint of the active region 21, the aluminum content x thus increases on each side of the abrupt junction 24. The refractive index accordingly decreases in each case.

The sub-regions 221, 222 of the field-shaping layers 22 in each case have a thickness of 940 nm.

The cladding layers 26, which are in each case arranged on the side of the field-shaping layers 22 remote from the active region 21, in each case have a thickness of 1000 nm and contain the material $Al_{0.50}Ga_{0.50}As$. The aluminum content of the cladding layers 26 is thus higher than the aluminum content of the field-shaping layers. Consequently the refractive index of the cladding layers is smaller than the refractive index of the field-shaping layers 22, such that a transverse mode of the radiation produced in the active region 21 may be limited at least to a considerable extent to the region between the cladding layers.

The carrier 29 is expediently electrically conductive. Where the carrier 29 is based on semiconductor material, for instance GaAs, Ge, Si or GaP, it is expediently doped in the same way as the semiconductor layers 22, 26 arranged between the carrier 29 and the active region 21.

In contrast, the carrier 29 may also be of electrically insulating construction. In this case the further contact layer 32 is expediently arranged on the side of the carrier 29 facing the active region 21.

In this first exemplary embodiment, the refractive index profile is thus achieved in that the material composition of the semiconductor layer sequence of the semiconductor body 2 is varied suitably in the deposition direction, i.e., perpendicular to the main direction of extension of the semiconductor layers of the semiconductor body 2.

Compound semiconductor materials which are particularly suitable for the field-shaping layers 22 are those in which the refractive index may be adjusted by varying the composition of the compound semiconductor material.

In this way a radiation-emitting component may be produced whose emitted far field radiation exhibits greater homogeneity at a predetermined distance than a component which emits radiation with a Gaussian-shaped radiation pattern.

A rectangle of maximum area which extends under the curve of the intensity profile of the far field preferably fills at least 50%, particularly preferably at least 60%, most preferably at least 65%, of the total area under the curve of the intensity profile of the far field.

Such a radiation-emitting component is particularly suitable as a pump laser.

A further exemplary embodiment of a method of producing a radiation-emitting component is illustrated schematically in FIGS. 2A to 2E. This second exemplary embodiment substantially corresponds to the first exemplary embodiment. In contrast thereto, the predetermined far field radiation pattern is a rectangular profile, i.e., it is the profile of a far field of ideal homogeneity in which a rectangle under the curve fills the entire area.

Figure 2A:
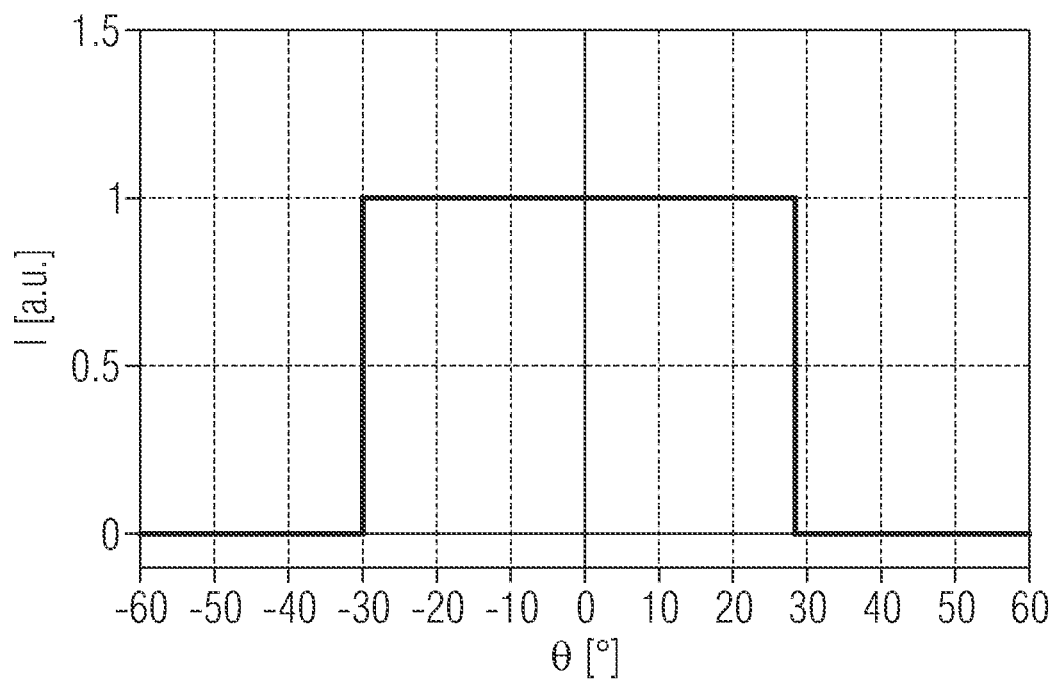
Figure 2B:
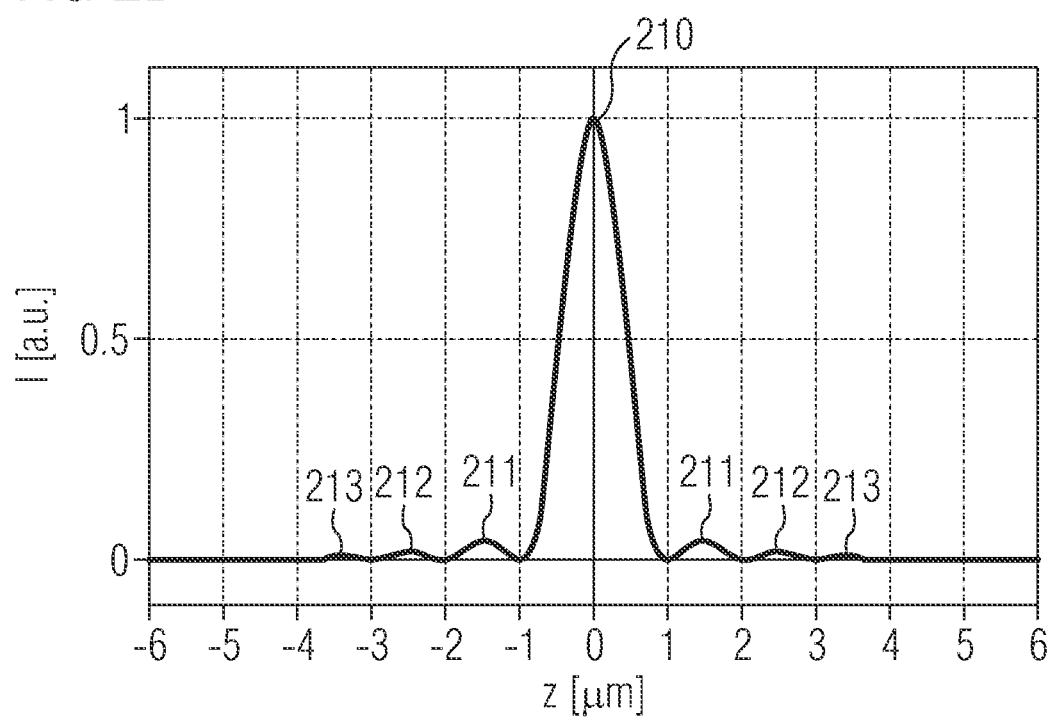

The near field on which FIG. 2A is based, which is calculated by spatial Fourier transformation from the profile shown in FIG. 2A, is shown in FIG. 2B. In addition to a main maximum 210 the intensity profile exhibits a plurality of secondary maxima 211, 212, 213. Unlike the intensity profile shown in FIG. 1B, this thus also exhibits values differing from 0 at greater distances, for instance for z=3.5 µm.

Figure 2C:
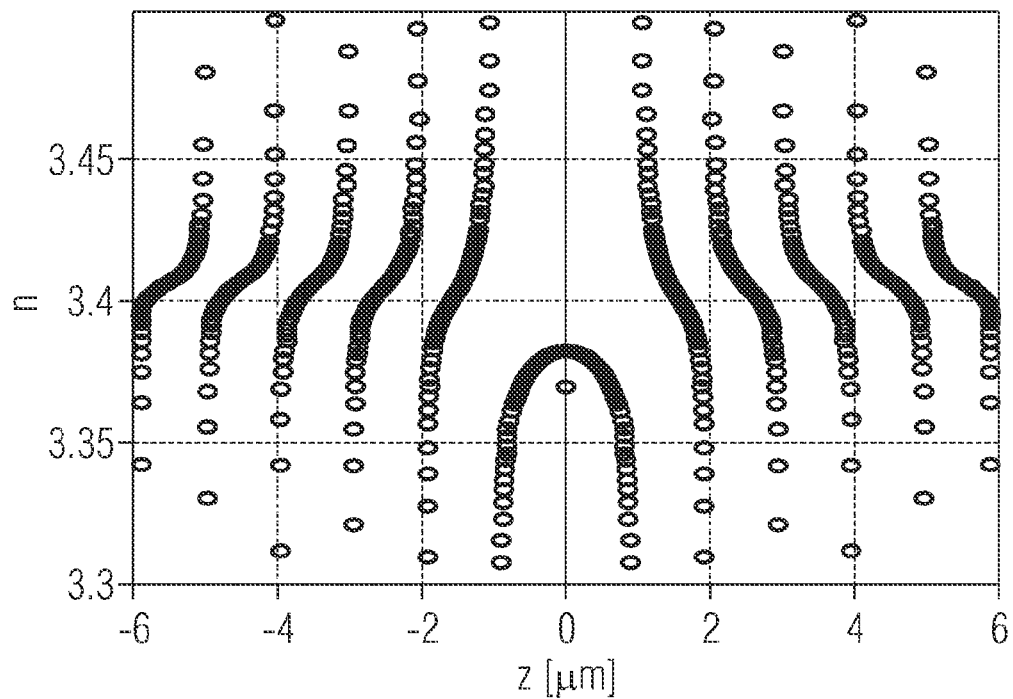
Figure 2D:
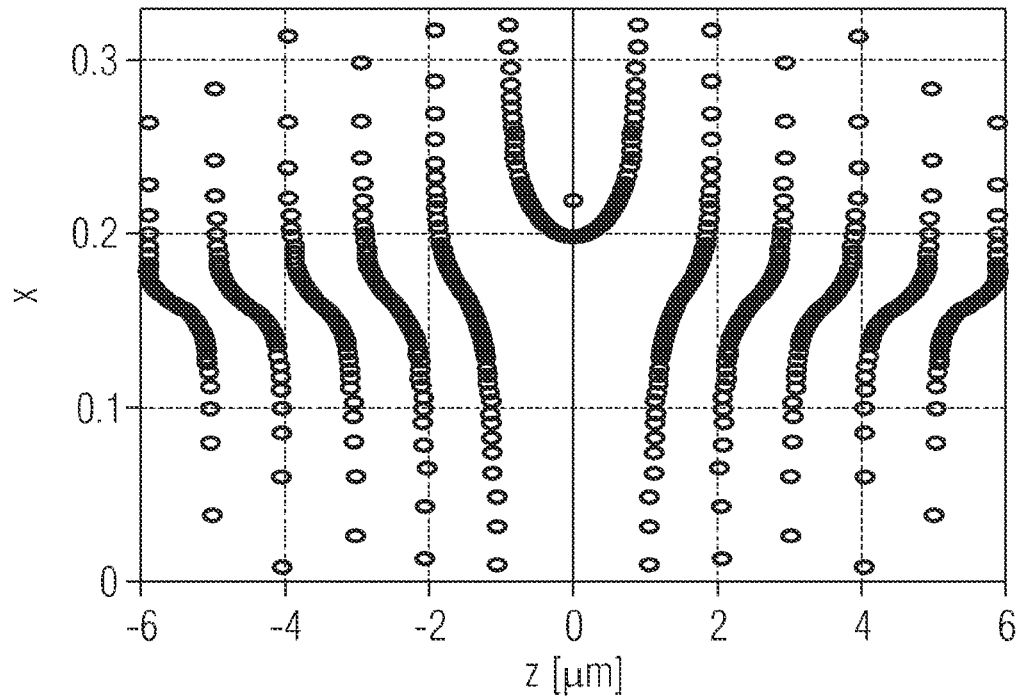

The values determined from the near field shown in FIG. 2B for the refractive index profile n or for the aluminum content x may be calculated as described in connection with FIGS. 1C and 1D and are shown in FIG. 2C or 2D. A radiation-emitting component 1 with a semiconductor body 2, whose layer structure is such that the radiation produced in the active region 21 includes a far field at a predetermined distance, the far field approaching the ideal profile shown in FIG. 2A, is shown schematically in sectional view in FIG. 2E.

The structure of the radiation-emitting component 1 substantially corresponds to the radiation-emitting component 1 described in connection with FIG. 1E. In contrast thereto, the field-shaping layers 22 each include an additional sub-region 223, which is provided on the side of the further sub-region 222 remote from the active region 21.

The field-shaping layers 22 each include two abrupt junctions 24, which are formed between the sub-region 221 and the further sub-region 222 or between the further sub-region 222 and the additional sub-region 223. Preferably, the aluminum content in the additional sub-region 223 of the field-shaping layer 22 increases, particularly preferably continuously, as the distance to the active region increases. The refractive index of the further field-shaping layer accordingly decreases as the distance to the active region increases.

By means of the refractive index profile described, which on each side of the active region 21 in each case includes two abrupt junctions 24, at which the refractive index increases abruptly in each case from the standpoint of the active region, an intensity distribution of the near field may form between the cladding layers 26 in the field-shaping layers 22 in such a way that at a predetermined distance the far field radiation emitted by the active region 21 approaches the radiation pattern of ideal homogeneity.

Figure 4A:
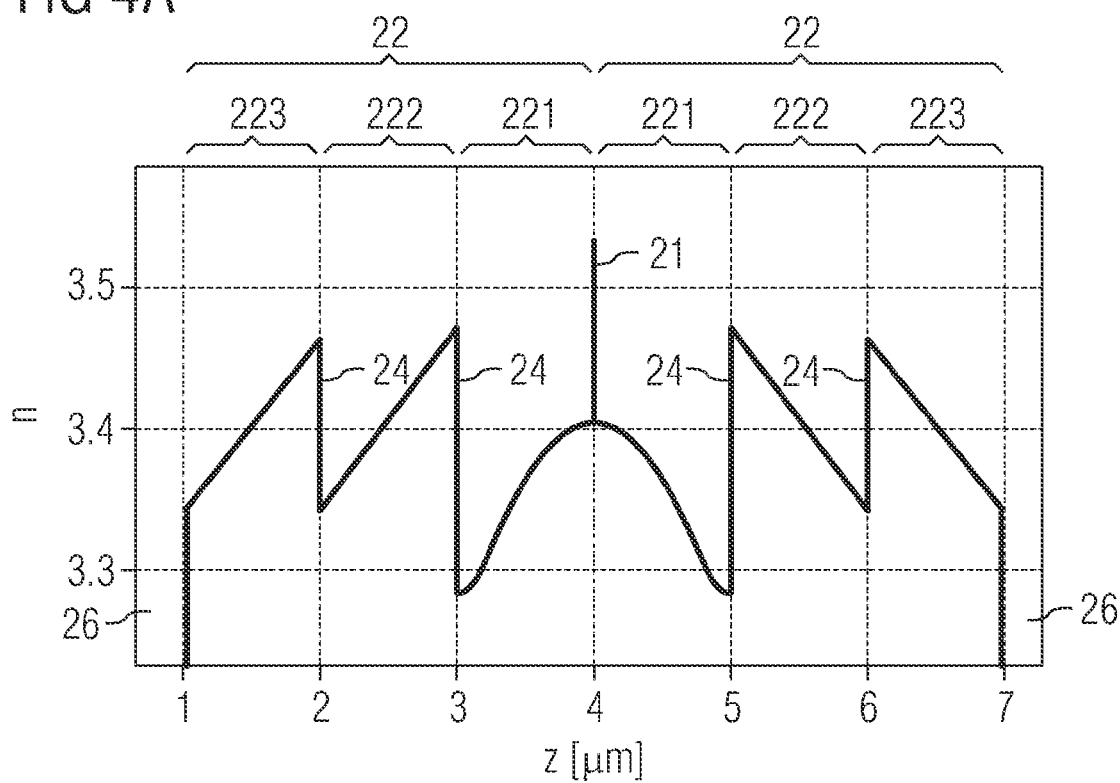
FIGS. 4A to 4C show results of electrooptical simulations, with FIG. 4A showing a refractive index profile, FIG. 4B an associated intensity distribution of the near field and FIG. 4C the radiant power P as a function of the injected current j, for the radiation-emitting component constructed as in FIG. 2E.
Figure 4B:
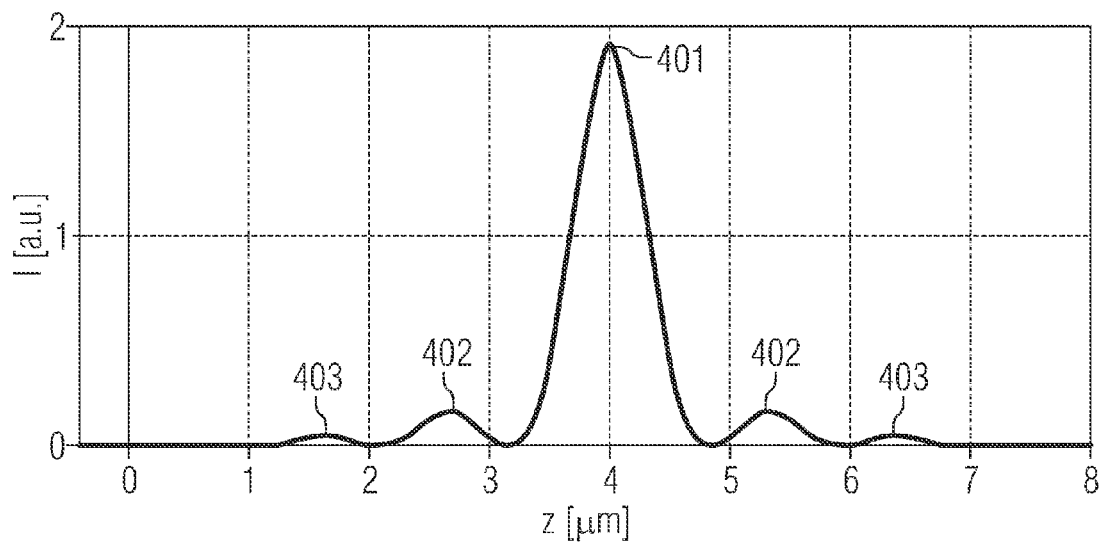
Figure 4C:
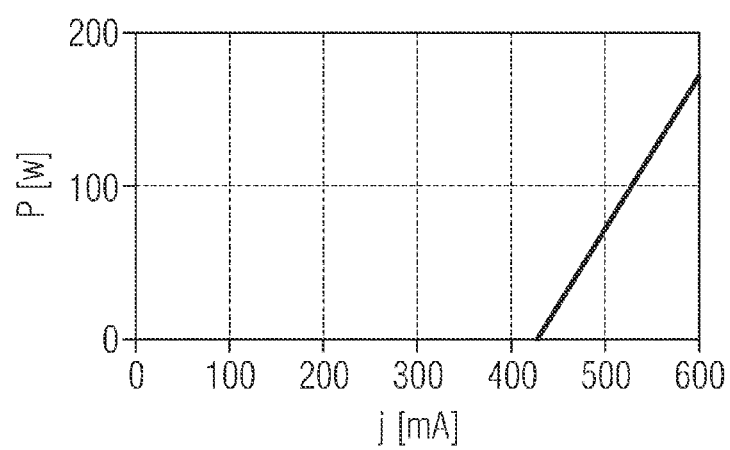

FIGS. 4A to 4C show results of electro-optical simulations for a radiation-emitting component 1 which is embodied as per the exemplary embodiment described in connection with FIG. 2E.

The z direction here corresponds in each case to the deposition direction of the semiconductor layers of the semiconductor body 2, the zero point in this illustration being the interface of the carrier 29 facing the active region 21. The refractive index profile illustrated in FIG. 4A in each case includes two abrupt junctions 24 on each side of the active region 21, at which the refractive index increases abruptly from the standpoint of the active region. On each side of the abrupt junction 24 the refractive index decreases in each case as the distance from the active region 21 increases.

The refractive index profile is configured symmetrically relative to the active region 21. Symmetrical emission of the radiation produced in the active region 21 is simplified thereby.

The near field resulting from the refractive index profile shown in FIG. 4A is shown in FIG. 4B as intensity distribution in the deposition direction z. In addition to the main maximum 401, the intensity distribution in each case includes on each side the secondary intensity maxima 402 and 403 and thus differs markedly from a component with a Gaussian far field radiation pattern. In a Gaussian far field, the associated near field also includes a Gaussian shape and thus does not exhibit any secondary maxima.

As a comparison of FIG. 4A with FIG. 4B shows, the secondary maximum 402 develops in the further sub-region 222 of the field-shaping layer 22 and the secondary maximum 403 develops in the additional sub-region 223 of the field shaping layer 22. The proportion of the intensity associated with the main maximum 401 is limited in the z direction to the active region 21 and the sub-regions 221 of the field-shaping layers 22. Owing to the refractive index profile described, the field-shaping layers 22 are thus capable of configuring the near field of the radiation produced in the active region 21 in such a way that the resultant far field exhibits greater homogeneity at a predetermined distance than a Gaussian radiation pattern.

The near field shown in FIG. 4B includes an overlap (confinement) with the active region of 0.8%. Higher order optical modes have a significantly lower confinement factor and, according to the simulations, do not oscillate.

The simulated profile of the output power P as a function of the injected current j is shown in FIG. 4C. The component includes a laser threshold of just over 400 mA. The steepness amounts to approximately 1 W/A. The illustrated simulations show that, using the described method, it is possible to produce a component which exhibits a homogenized far field simultaneously combined with good electro-optical characteristics.

Figure 5:
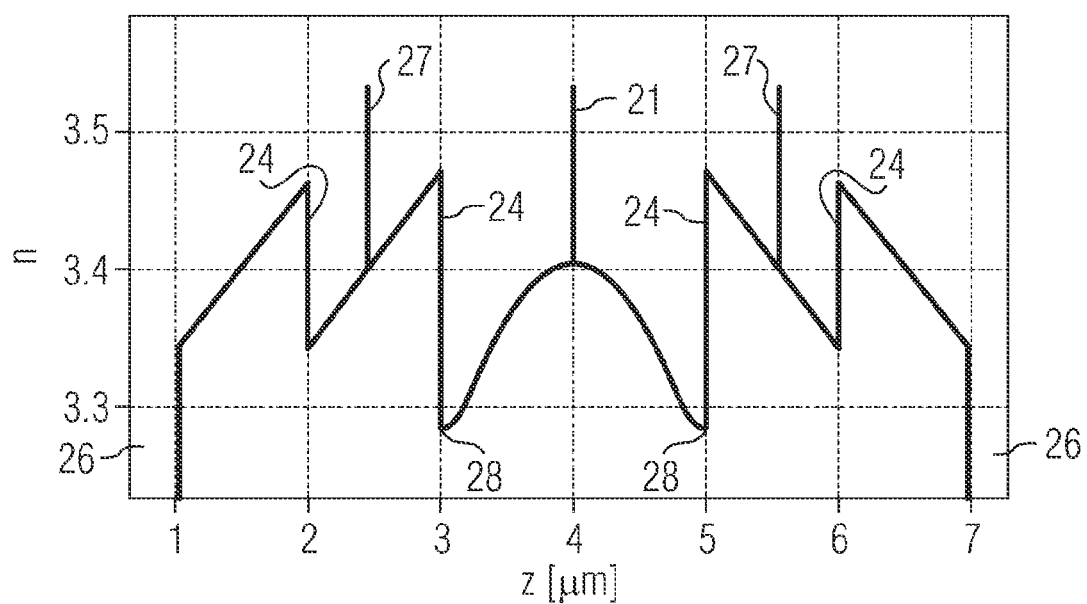
FIG. 5 shows the qualitative shape of a refractive index profile for a second exemplary embodiment of a radiation-emitting component.

A qualitative profile for a refractive index profile of a third exemplary embodiment for a radiation-emitting component is shown in FIG. 5.

The third exemplary embodiment substantially corresponds to the second exemplary embodiment described in connection with FIG. 4A. In contrast thereto, in addition to the active region 21 the radiation-emitting component 1 in each case includes a further active region 27 on each side of the active region 21. The further active regions 27 are arranged in each case in the field-shaping layers 22.

Between the active region 21 and the further active regions 27, a tunnel zone 28 is in each case formed. The tunnel regions 28 are provided for connecting the further active region 27 and the active region 21 together in series. The tunnel regions 28 in each case preferably include a highly doped n-conducting semiconductor layer and a highly doped p-conducting semiconductor layer. The doping concentrations preferably amount in each case to at least $10^{18}$ cm$^{-3}$, particularly preferably at least $10^{19}$ cm$^{-3}$.

The tunnel regions 28 are preferably arranged in the region of an abrupt junction 24 of the refractive index profile. In these regions the intensity of the near field, as shown in FIGS. 4A and 4B, is comparatively low. Absorption of the radiation intensity of the near field in the tunnel regions 28 may thus be prevented or at least greatly reduced.

The active region 21 and the further active regions 27 may be coherently coupled. This means that the radiation produced in the active region 21 and the radiation produced in the further active regions 27 have a common transverse optical mode. The tunnel regions 28 are in each case preferably arranged in a node of this optical mode, which may be formed as described above in the region of the abrupt junction 24.

As a result of the additional active regions 27 the overall radiant power emerging from the component may be increased.

Figure 6:
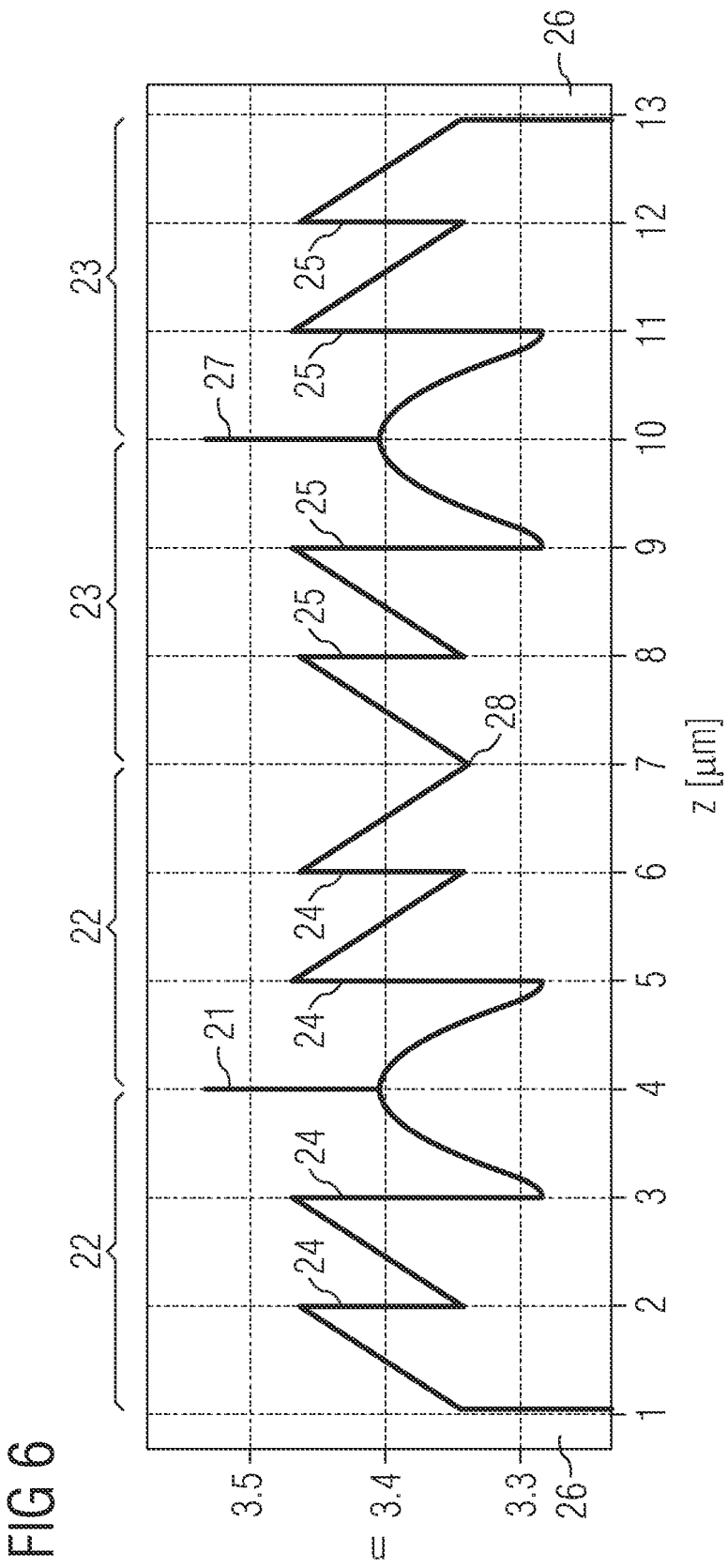
FIG. 6 shows the qualitative shape of a refractive index profile for a second exemplary embodiment of a radiation-emitting component.

A refractive index profile for a fourth exemplary embodiment of a radiation-emitting component is illustrated in FIG. 6. This fourth exemplary embodiment substantially corresponds to the second exemplary embodiment described in connection with FIG. 4A. In contrast thereto, the semiconductor body 2 of the radiation-emitting component 1 includes a further active region 27. The active region 21 and the further active region 27 are arranged above one another, the further active region being arranged between two further field-shaping layers 23. The active region 21 and the further active region 27 are similarly embodied in this exemplary embodiment.

Furthermore, the field-shaping layers 22 and the field-shaping layers 23 are similarly embodied. Thus, on each side of the further active region 27 the refractive index profile in each case includes two abrupt junctions 25, at which in each case the refractive index increases from the standpoint of the further active region 27.

In the active region 21 and the further active region 27 there is formed a tunnel region 28, which may be formed as described in connection with FIG. 5. Unlike the exemplary embodiment described in connection with FIG. 5, the active region 21 and the further active region 27 are comparatively far away from one another. By means of the field-shaping layers 22 or the further field-shaping layers 23, the radiation produced in the active region 21 or the further active region 27 are decoupled from one another.

The active regions 21 and 27 may thus produce coherent radiation largely independently of one another. Unlike in the exemplary embodiment illustrated, a further cladding layer may be arranged between the field-shaping layer 22 and the further field-shaping layer 23 for more extensive separation of the optical modes. This further cladding layer expediently has a refractive index which is smaller than the refractive index of the field-shaping layers 22 and the further field-shaping layers 23.

Figure 7:
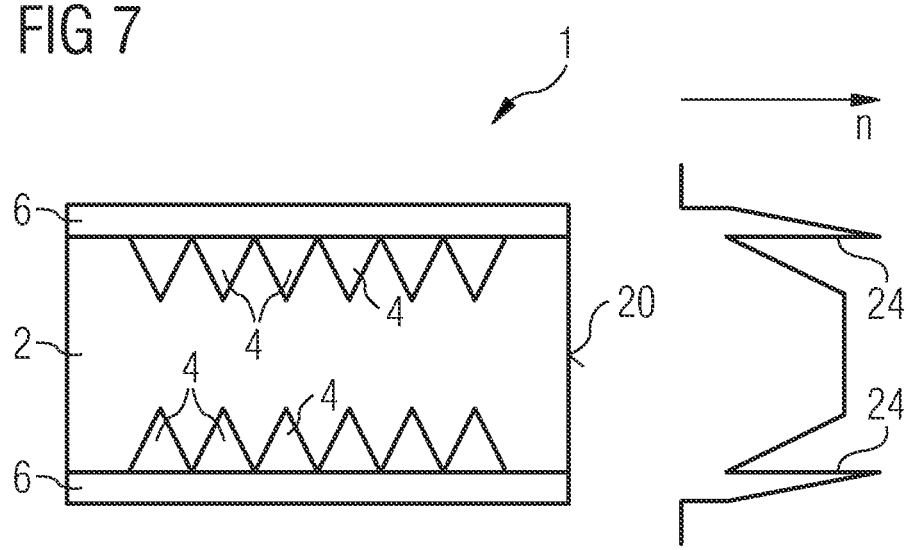
FIG. 7 is a schematic plan view of a fourth exemplary embodiment of an optoelectronic component with an associated qualitative refractive index profile.

A fifth exemplary embodiment of a radiation-emitting component is shown schematically in plan view in FIG. 7. The vertical structure of the semiconductor body 2 with the semiconductor layer sequence may here be embodied as in the exemplary embodiments described in connection with FIG. 4A to FIG. 6. A qualitative representation of the shape of the associated refractive index profile is furthermore provided.

The semiconductor body 2 includes recesses 4, which extend into the semiconductor body 2 perpendicularly to the main emission direction of the radiation emerging from the side face 20. The recesses 4 may be at least partially filled with a filler material, which preferably has a smaller refractive index than the semiconductor body 2.

From a standpoint external to the semiconductor body 2, the recesses 4 taper as their depth increases. In this way a refractive index profile may be provided which, when averaged in the main emission direction, reduces towards the edge of the semiconductor body 2 in the region of the recesses 4. The recesses 4 extend from opposing sides of the semiconductor body 2 into the semiconductor body. On these sides there is in each case arranged an edge layer 6, whose refractive index reduces as the distance from the semiconductor body 2 increases. In contrast, an edge layer 6 may be provided with a constant refractive index profile.

The edge layers 6 preferably contain a dielectric material, for example, contain an oxide, for instance silicon oxide or titanium oxide, a nitride, for instance silicon nitride or an oxynitride, for instance silicon oxynitride. The edge layers 6 may also in each case be of multilayer construction, the refractive indices of the sub-layers reducing as the distance from the semiconductor body increases.

An abrupt junction 24 is formed in each case between the semiconductor body 2 and the edge layers 6, at which junction the refractive index increases abruptly from the standpoint of the interior of the semiconductor body 2. The abrupt junction 24 is thus formed at an interface between the semiconductor body 2 and a layer adjoining it.

In this way a further refractive index profile may be formed in a direction extending perpendicularly to the main emission direction and perpendicularly to the deposition direction of the semiconductor layers of the semiconductor body 2. By means of this further refractive index profile, the near field may be shaped in this direction in such a way that the far field resulting from the near field corresponds in this direction to a predetermined radiation pattern.

In this way, the radiation-emitting component may be embodied such that, along two mutually perpendicular axes, the far field radiation pattern corresponds to or at least approaches a predetermined profile.

The invention is not restricted by the description given with reference to the exemplary embodiments. Rather, the invention encompasses any novel feature and any combination of features, including, in particular, any combination of features in the claims, even if this feature or this combination is not itself explicitly indicated in the claims or the exemplary embodiments.

The invention claimed is:

1. A radiation-emitting component comprising:
   an active region provided for producing radiation, the component having a main emission direction; and
   field-shaping layers arranged on each side of the active region and a refractive index profile being formed perpendicular to the main emission direction of radiation by means of the field-shaping layers, the refractive index profile comprising an abrupt junction on each side of the active region, wherein the refractive index profile at each junction increases from the standpoint of the active region,
   wherein one of the field-shaping layer comprises a sub-region and a further sub-region, a refractive index in the sub-region and the further sub-region reducing as the distance from the active region increases, wherein the sub-region and the further sub-region are arranged on a same side of the active region.

2. The radiation-emitting component according to claim 1, wherein the abrupt junction is arranged between the sub-region and the further sub-region.

3. The radiation-emitting component according to claim 1, wherein the component comprises a semiconductor body with a semiconductor layer sequence, the active region being formed in the semiconductor body, wherein the refractive index profile extends perpendicularly to a main direction of extension of the semiconductor layer sequence of the semiconductor body.

4. The radiation-emitting component according to claim 3, further comprising recesses that extend into the semiconductor body.

5. The radiation-emitting component according to claim 1, further comprising a further active region that is provided for producing radiation.

6. The radiation-emitting component according to claim 5, further comprising a tunnel region between the active region and the further active region, wherein the radiation produced in the active region and the radiation produced in the further active region comprise a common transverse optical mode, the tunnel region being arranged in a node of the common transverse optical mode.

7. The radiation-emitting component according to claim 5, wherein one of the abrupt junctions is arranged between the active region and the further active region.

8. The radiation-emitting component according to claim 5, further comprising further field-shaping layers that are arranged on each side of the further active region, the refractive index profile having a further abrupt junction on each side of the further active region, wherein the refractive index profile of each further abrupt junction increases from the standpoint of the further active region.

9. A radiation-emitting component comprising:
   an active region provided for producing radiation, the component having a main emission direction;
   field-shaping layers arranged on each side of the active region and a refractive index profile being formed perpendicular to the main emission direction of radiation by means of the field-shaping layers, the refractive index profile comprising an abrupt junction on each side of the active region, wherein the refractive index profile at each junction increases from the standpoint of the active region;
   a further active region that is provided for producing radiation; and
   further field-shaping layers that are arranged on each side of the further active region, the refractive index profile having a further abrupt junction on each side of the further active region, wherein the refractive index profile of each further abrupt junction increases from the standpoint of the further active region.

10. The radiation-emitting component according to claim 9, wherein the component comprises a semiconductor body with a semiconductor layer sequence, the active region being formed in the semiconductor body, wherein the refractive index profile extends perpendicularly to a main direction of extension of the semiconductor layer sequence of the semiconductor body.

11. The radiation-emitting component according to claim 9, further comprising a tunnel region between the active region and the further active region, wherein the radiation produced in the active region and the radiation produced in the further active region comprise a common transverse optical mode, the tunnel region being arranged in a node of the common transverse optical mode.

12. The radiation-emitting component according to claim 9, wherein one of the abrupt junctions is arranged between the active region and the further active region.

13. The radiation-emitting component according to claim 9, wherein the component comprises a semiconductor body with a semiconductor layer sequence, the active region being formed in the semiconductor body, the component further comprising recesses that extend into the semiconductor body.

14. The radiation-emitting component according to claim 1, wherein the component comprises a semiconductor body with a semiconductor layer sequence, the active region being formed in the semiconductor body, the component further comprising recesses that extend into the semiconductor body.

15. A method of producing the radiation-emitting component according to claim 1, the method comprising:
   a) predetermining a far field radiation pattern;
   b) determining from the predetermined far field radiation pattern the refractive index profile for the radiation-emitting component in a direction extending perpendicularly to the main emission direction of the component;
   c) determining a structure for the component such that the component comprises the refractive index profile; and
   d) forming the radiation-emitting component according to the determined structure.

16. The method according to claim 15, wherein determining the refractive index profile comprises:

determining an associated near field from the predetermined far field radiation pattern, and determining the refractive index profile for the radiation-emitting component from the near field.

17. The method according to claim 15, wherein forming the radiation-emitting component comprises forming a radiation-emitting component that comprises a semiconductor body with a semiconductor layer sequence, the semiconductor layer sequence comprising an active region that provides radiation, wherein forming the radiation-emitting component comprises depositing the semiconductor body with the semiconductor layer sequence, the refractive index profile being configured by means of a suitable material composition in a deposition direction for the semiconductor layer sequence of the semiconductor body.

18. The method according to claim 15, wherein the far field radiation pattern is predetermined along two axes positioned obliquely or perpendicularly to one another and wherein determining the refractive index profile further comprises determining a further refraction index profile perpendicularly to the main emission direction and perpendicularly to the refractive index profile and wherein determining the structure of the component comprises determining the structure in such a way that the component comprises the determined further refractive index profile.

* * * * *

UNITED STATES PATENT AND TRADEMARK OFFICE
CERTIFICATE OF CORRECTION

PATENT NO.        : 8,576,889 B2                                                                 Page 1 of 1
APPLICATION NO. : 12/670984
DATED             : November 5, 2013
INVENTOR(S)       : Peter Brick It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 800 days.

Signed and Sealed this

Twenty-second Day of September, 2015

Michelle K. Lee
*Director of the United States Patent and Trademark Office*